United States Patent
Byun et al.

(10) Patent No.: US 12,240,709 B2
(45) Date of Patent: Mar. 4, 2025

(54) TOWER LIFT

(71) Applicant: SEMES CO., LTD., Cheonan-si (KR)

(72) Inventors: Hee Jae Byun, Yongin-si (KR); Sang Oh Kim, Seoul (KR); Na Hyun Lee, Ansan-si (KR); Myung Jin Lee, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 201 days.

(21) Appl. No.: 17/750,359

(22) Filed: May 22, 2022

(65) Prior Publication Data

US 2023/0166925 A1 Jun. 1, 2023

(30) Foreign Application Priority Data

Nov. 30, 2021 (KR) .................. 10-2021-0168350

(51) Int. Cl.
   *B66F 7/02* (2006.01)
   *B65G 47/90* (2006.01)
   *B66F 11/00* (2006.01)
   *H01L 21/677* (2006.01)

(52) U.S. Cl.
   CPC ......... *B65G 47/904* (2013.01); *B65G 47/905* (2013.01); *B66F 11/00* (2013.01); *B66F 7/02* (2013.01); *H01L 21/67712* (2013.01)

(58) Field of Classification Search
   CPC ........ H01L 21/6773; B66F 11/00; B66F 7/02; B66F 9/07
   See application file for complete search history.

(56) References Cited

U.S. PATENT DOCUMENTS

| | | | | |
|---|---|---|---|---|
| 2005/0053450 A1* | 3/2005 | Kantola | ............... | B65G 1/0407 414/273 |
| 2009/0162176 A1* | 6/2009 | Link | .................... | B65G 1/0421 414/659 |
| 2014/0112742 A1* | 4/2014 | Yang | ........................ | B25J 9/044 414/222.13 |
| 2019/0241415 A1* | 8/2019 | Tanaka | .................... | B65G 1/023 |
| 2019/0344978 A1* | 11/2019 | Jun | ...................... | H01L 21/6773 |
| 2020/0231419 A1* | 7/2020 | Kalm | ........................ | B66F 9/07 |
| 2023/0076551 A1* | 3/2023 | Lee | ...................... | H01L 21/6773 |

FOREIGN PATENT DOCUMENTS

| | | |
|---|---|---|
| JP | 06-183513 | 7/1994 |
| JP | H07242306 A * | 9/1995 |
| JP | 2001-344829 | 12/2001 |
| KR | 10-2019-0128438 | 11/2019 |
| KR | 10-2020-0049227 | 5/2020 |

OTHER PUBLICATIONS

Office Action from Japan Patent Office dated Jan. 31, 2023.

* cited by examiner

*Primary Examiner* — Kaitlin S Joerger

(57) ABSTRACT

A tower lift includes a main frame, a first carriage module and a second carriage module connected with each other inside the main frame at left and right sides of the main frame, respectively, having the same weight as each other, and configured to be moved in a vertical direction, and a driving module installed on the main frame and configured to move the first carriage module and the second carriage module in the vertical direction.

20 Claims, 2 Drawing Sheets

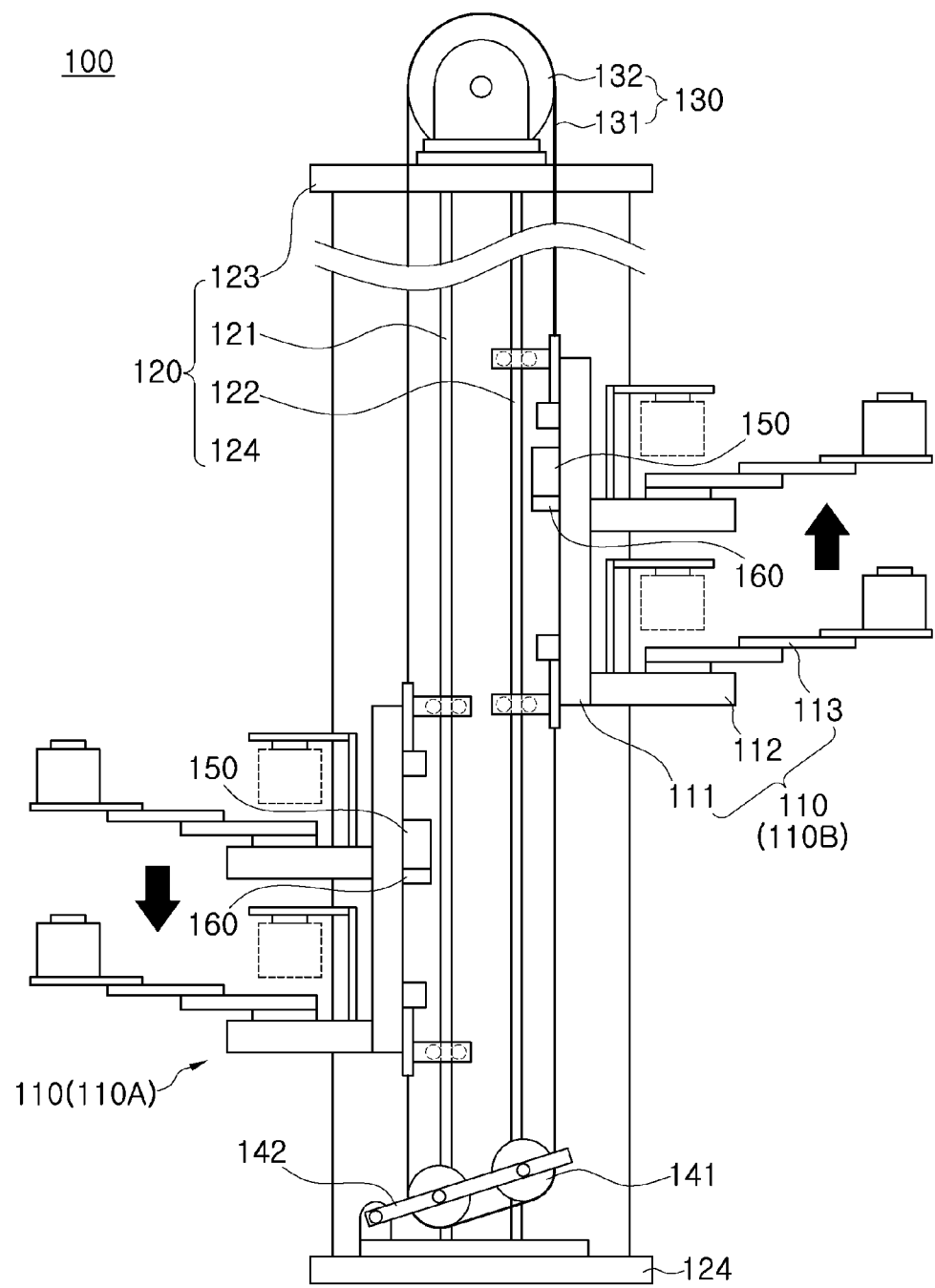

TOWER LIFT

CROSS REFERENCE TO RELATED APPLICATION

The present application claims priority to Korean Patent Application No. 10-2021-0168350, filed Nov. 30, 2021, the entire contents of which are incorporated by reference herein for all purposes.

BACKGROUND OF THE INVENTION

Field of the Invention

The present disclosure relates to a tower lift and, more particularly, to a tower lift that can be used to transfer objects.

Description of the Related Art

In general, a manufacturing line of a semiconductor or display manufacturing plant is composed of multiple levels, and facilities for performing processes such as deposition, exposure, etching, ion implantation, cleaning, etc. may be disposed on each level. A semiconductor device or a display device can be manufactured by repeatedly performing a series of unit processes on a semiconductor wafer used as a semiconductor substrate or a glass substrate used as a display substrate.

Meanwhile, material transfer between the respective levels, i.e., materials such as semiconductor wafers or glass substrates, may be transferred by a tower lift that is installed in the vertical direction through the respective levels.

A conventional tower lift may include a carriage module for material transfer, a main frame on which guide rails for guiding the carriage module in the vertical direction are installed, and a drive module for moving the carriage module in the vertical direction using drive belts such as a timing belt. In the case of the conventional tower lift, it is common to install a weight body on the opposite side of the carriage module in order to balance the loading weight of the heavy carriage module.

However, the weight body is not provided with a safety device such as a brake module and thus may fall immediately when the belt breaks, which is problematic.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2019-0128438

SUMMARY OF THE INVENTION

Accordingly, the present disclosure has been made keeping in mind the above problems occurring in the related art, and an objective of the present disclosure is to provide a tower lift capable of improving transfer efficiency per hour.

In order to achieve the above objective, according to one aspect of the present disclosure, there is provided a tower lift including: a main frame; a first carriage module and a second carriage module connected with each other inside the main frame at left and right sides of the main frame, respectively, having the same weight as each other, and configured to be moved in a vertical direction; and a driving module installed on the main frame and configured to move the first carriage module and the second carriage module in the vertical direction.

The first carriage module and the second carriage module may have the same structure as each other.

The main frame may include: an upper body and a lower body positioned to be spaced apart from each other in the vertical direction; and a first guide shaft and a second guide shaft positioned to be spaced apart from each other in a horizontal direction and positioned to be parallel to each other in the vertical direction, each of the first and second guide shafts having a first end coupled to the upper body and a second end coupled to the lower body.

The tower lift may include an anti-fall module installed on each of the first carriage module and the second carriage module and configured to prevent the first carriage module and the second carriage module from falling.

The anti-fall module may be coupled to the first carriage module and may be installed adjacent to the first guide shaft.

The anti-fall module may be coupled to the second carriage module and may be installed adjacent to the second guide shaft.

The tower lift may include a fall detection sensor installed on each of the first carriage module and the second carriage module and configured to detect a fall of each of the first carriage module and the second carriage module.

The driving module may include: a timing belt coupled to the first carriage module and the second carriage module; and a rotary motor installed on the main frame and configured to rotate the timing belt.

The tower lift may include a tension control module disposed at a lower portion of the main frame and configured to control tension of the timing belt.

Each of the first carriage module and the second carriage module may include: a lifting plate installed to be movable along the main frame and configured to be lifted by the driving module; at least one support plate coupled to the lifting plate; and a carriage robot installed on the support plate and configured to handle an object.

According to an aspect of the present disclosure, there is provided a tower lift including: a main frame including a first guide shaft and a second guide shaft spaced apart from each other; a first carriage module configured to be moved in a vertical direction along the first guide shaft; a second carriage module configured to be moved in the vertical direction along the second guide shaft, having a weight corresponding to that of the first carriage module, and configured to be moved in a direction opposite to a moving direction of the first carriage module; and a driving module including a timing belt having a closed curve shape and coupled to the first carriage module and the second carriage module, and a rotary motor installed on the main frame and configured to rotate the timing belt.

The tower lift may include an anti-fall module installed on each of the first carriage module and the second carriage module and configured to prevent the first carriage module and the second carriage module from falling.

The anti-fall module may be coupled to the first carriage module and may be installed adjacent to the first guide shaft.

The anti-fall module may be coupled to the second carriage module and may be installed adjacent to the second guide shaft.

The tower lift may include a fall detection sensor installed on each of the first carriage module and the second carriage module and configured to detect a fall of each of the first carriage module and the second carriage module.

The tower lift may include a tension control module disposed at a lower portion of the main frame and configured to control tension of the timing belt.

The first carriage module and the second carriage module may have the same structure as each other.

The first carriage module may include: a lifting plate fixedly coupled to the timing belt and installed to surround the first guide shaft; at least one support plate coupled to the lifting plate; and a carriage robot installed on the support plate and configured to handle an object.

The second carriage module may include: a lifting plate fixedly coupled to the timing belt and installed to surround the second guide shaft; at least one support plate coupled to the lifting plate; and a carriage robot installed on the support plate and configured to handle an object.

The main frame may include: an upper body coupled to an upper end of each of the first guide shaft and the second guide shaft; and a lower body positioned to be spaced apart downwardly from the upper body and coupled to a lower end of each of the first guide shaft and the second guide shaft.

An advantage of the tower lift according to the embodiment of the present disclosure is that it is possible to easily set the loading balance of the timing belt by the provision of the first carriage module and the second carriage module. As a result, the tower lift can transfer the object to each of the first carriage module and the second carriage module and thus is advantageous over the conventional tower lift in that the transfer amount per hour can be increased.

Another advantage of the tower lift according to the embodiment of the present disclosure is that it is possible to use the first carriage module and the second carriage module installed on one main frame without requiring separate installation spaces, and to allow the first carriage module and the second carriage module to share components. This can reduce the overall size, thereby improving space utilization.

Still another advantage of the tower lift according to the embodiment of the present disclosure is that it is possible to prevent, when the timing belt is broken, the first carriage module and the second carriage module from falling by using the fall detection sensor and the anti-fall module. This can prevent damage to the tower lift.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 2 is a view illustrating a state in which a first carriage module and a second carriage module are positioned at different heights.

DETAILED DESCRIPTION OF THE INVENTION

Figure 1:
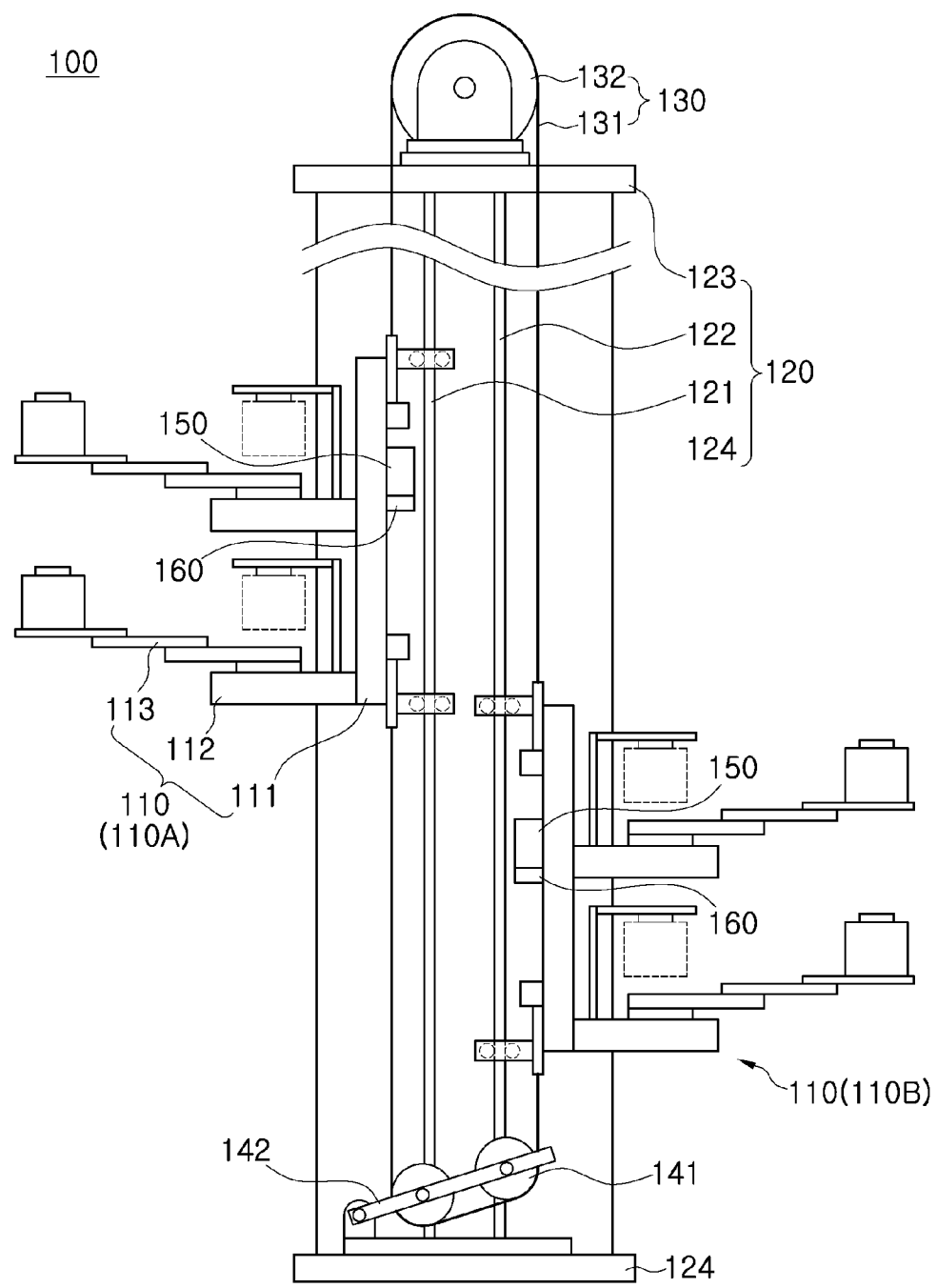
FIG. 1 is a view illustrating a tower lift according to an embodiment of the present disclosure.

Hereinafter, exemplary embodiments of the present disclosure will be described in detail with reference to the accompanying drawings such that the present disclosure can be easily embodied by one of ordinary skill in the art to which this disclosure belongs. The present disclosure may, however, be embodied in many different forms and should not be construed as being limited to only the embodiments set forth herein.

For clarity, a description of parts not related to describing the present disclosure is omitted here, and the same reference numerals are allocated to the same or similar components throughout the disclosure.

Components having the same structure in various embodiments will be allocated the same reference numeral and explained only in a representative embodiment, and components which are different from those of the representative embodiment will be described in the other embodiments.

It will be understood that when an element is referred to as being "connected to" or "coupled to" another element, the element can be directly connected to or coupled to the other element or be indirectly connected to or coupled to the other element having an intervening element therebetween. Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a tower lift according to an embodiment of the present disclosure will be described in detail with reference to the drawings.

Referring to FIGS. 1 and 2, the tower lift 100 according to the embodiment of the present disclosure may include a main frame 120, a first carriage module 110A, a second carriage module 110B, and a driving module 130.

The main frame 120 receives the first carriage module 110A and a second carriage module 110B, which will be described later, and guides movement paths of the first carriage module 110A and the second carriage module 110B. The driving module 130, which will be described later, may be installed on the main frame 120.

The main frame 120 for this purpose may include, for example, an upper body 123, a lower body 124, a first guide shaft 121, and a second guide shaft 122.

The upper body 123 and the lower body 124 are positioned to be spaced apart from each other in the vertical direction. The lower body 124 may be installed in a working space. The driving module 130, which will be described later, may be installed on the upper body 123.

The first guide shaft 121 and the second guide shaft 122 are positioned to be spaced apart from each other in the horizontal direction, and are positioned to be parallel to each other in the vertical direction. Each of the first guide shaft 121 and the second guide shaft 122 has a first end coupled to the upper body 123 and a second end coupled to the lower body 124.

The first guide shaft 121 and the second guide shaft 122 may guide a lifting path of the first carriage module 110A and the second carriage module 110B, which will be described later. The first guide shaft 121 and the second guide shaft 122 for this purpose may include may be, for example, beams of circular or polygonal shape in cross-section, but are not limited thereto.

The first carriage module 110A and the second carriage module 110B transfer an object to various positions while being lifted by the driving module 130. The first carriage module 110A and the second carriage module 110B are connected to each other inside the main frame 120 at left and right sides of the main frame 120, respectively, have the same weight, and are moved in the vertical direction.

In more detail, the first carriage module 110A is moved in the vertical direction along the first guide shaft 121. The second carriage module 110B is moved in the vertical direction along the second guide shaft 122 and is connected to the first carriage module 110A.

In addition, the second carriage module 110B has a weight corresponding to that of the first carriage module 110A, and is moved in a direction opposite to the moving direction of the first carriage module 110A. In other words, when the first carriage module 110A is moved upwardly, the second carriage module 110B may be moved downwardly.

The first carriage module 110A and the second carriage module 110B as described above may have the same structure. Unlike a conventional tower lift including a separate weight body, the tower lift 100 according to the embodiment of the present disclosure uses the first carriage module 110A and the second carriage module 110B having the same weight and the same structure. This allows the left and right weights of the tower lift 100 to be kept equal. In addition, the first carriage module 110A and the second carriage module 110B can use shared components, thereby allowing quick maintenance.

Meanwhile, each of the first carriage module 110A and the second carriage module 110B may include, for example, a lifting plate 111, at least one support plate 112, and a carriage robot 113.

The lifting plate 111 is installed to be movable along the main frame 120, and is lifted by the driving module 130. In more detail, the lifting plate 111 of the first carriage module 110A is fixedly coupled to a timing belt 131 and is installed to surround the first guide shaft 121. The lifting plate 111 of the second carriage module 110B is fixedly coupled to the timing belt 131 and is installed to surround the second guide shaft 122.

The support plate 112 is coupled to the lifting plate 111. At least one support plate 112 may be provided. When two support plates 112 are provided, the two support plates 112 may be positioned to be spaced apart from each other in the vertical direction.

The carriage robot 113 is installed on the support plate 112 and handles the object. The carriage robot 113 may handle a storage container such as a front opening unified pod (FOUP) in which a plurality of substrates are stored.

The driving module 130 is installed on the main frame 120 and moves the first carriage module 110A and the second carriage module 110B in the vertical direction.

The driving module 130 for this purpose may include, for example, the timing belt 131 and a rotary motor 132.

The timing belt 131 has a closed curve shape and is coupled to the first carriage module 110A and the second carriage module 110B. The rotary motor 132 is installed on the main frame 120 and rotates the timing belt 131.

Meanwhile, although not illustrated in the drawings, the driving module 130 may include a speed reducer (not illustrated) installed between the rotary motor 132 and the timing belt 131. In addition, the driving module 130 may further include an electromagnetic brake (not illustrated) connected to a rotary shaft of the rotary motor 132.

Since the first carriage module 110A and the second carriage module 110B described above are connected to the timing belt 131 and have the same weight, the loading weights may be kept equal on the left and right sides with respect to the driving module 130. The rotary motor 132 of the driving module 130 may stably roll the timing belt 131 without the need for generating a large torque.

Meanwhile, the tower lift 100 according to the embodiment of the present disclosure may include an anti-fall module 150.

The anti-fall module 150 is installed on each of the first carriage module 110A and the second carriage module 110B, and prevents the first carriage module 110A and the second carriage module 110B from falling.

In the case where the anti-fall module 150 is installed on the first carriage module 110A, the anti-fall module 150 may be coupled to the first carriage module 110A, and may be installed adjacent to the first guide shaft 121.

In the case where the anti-fall module 150 is installed on the second carriage module 110B, the anti-fall module 150 may be coupled to the second carriage module 110B, and may be installed adjacent to the second guide shaft 122.

When the first carriage module 110A or the second carriage module 110B falls, the anti-fall module 150 may abruptly increase a frictional force with the first guide shaft 121 or the second guide shaft 122 to thereby prevent the first carriage module 110A or the second carriage module 110B from colliding with the lower body 124 of the main frame 120.

Meanwhile, the tower lift 100 according to the embodiment of the present disclosure may include a fall detection sensor 160.

The fall detection sensor 160 is installed on each of the first carriage module 110A and the second carriage module 110B, and detects a fall of each of the first carriage module 110A and the second carriage module 110B. The fall detection sensor 160 for this purpose may include may be, for example, an acceleration sensor, but is not limited thereto.

When the fall detection sensor 160 detects a fall of the first carriage module 110A or the second carriage module 110B, an operation signal may be transmitted to the anti-fall module 150. The anti-fall module 150 may be then operated in response to the operation signal to thereby prevent the first carriage module 110A or the second carriage module 110B from falling.

Meanwhile, the tower lift 100 according to the embodiment of the present disclosure may include a tension control module 140.

The tension control module 140 is disposed at a lower portion of the main frame 120 and controls the tension of the timing belt 131. The tension control module 140 may include, for example, a roller for pressing a portion of the timing belt 131, but is not limited thereto. The tension control module 140 keeps the tension of the timing belt 131 constant. Therefore, the timing belt 131 may be stably rotated by the rotary motor 132 of the driving module 130 without idling.

The tension control module 140 may be in contact with a lower portion of the timing belt 131 positioned at a lower end portion of the tower lift 100, while the rotary motor 132 of the driving module 130 may be in contact with of a portion of the timing belt 131 positioned at an upper end portion of the tower lift 100.

As described above, the tower lift 100 according to the embodiment of the present disclosure can easily set the loading balance of the timing belt 131 by the provision of the first carriage module 110A and the second carriage module 110B. As a result, the tower lift 100 can transfer the object to each of the first carriage module 110A and the second carriage module 110B and thus is advantageous over the conventional tower lift in that the transfer amount per hour can be increased.

In addition, the tower lift 100 according to the embodiment of the present disclosure uses the first carriage module 110A and the second carriage module 110B installed on one main frame 120 without requiring separate installation spaces, and allows the first carriage module 110A and the second carriage module 110B to share components. This can reduce the overall size, thereby improving space utilization.

In addition, the tower lift 100 according to the embodiment of the present disclosure can prevent, when the timing belt 131 is broken, the first carriage module 110A and the second carriage module 110B from falling by using the fall detection sensor 160 and the anti-fall module 150. This can prevent damage to the tower lift 100.

The description of the present disclosure has been presented with reference to the accompanying drawings for purposes of illustration and description, but is not intended to be exhaustive or limited to the disclosure in the form disclosed. Many modifications and variations will be apparent to those of ordinary skill in the art without departing from the scope and spirit of the disclosure. Accordingly, all such modifications and variations are intended to be included within the scope of this disclosure as defined in the appended claims.

What is claimed is:

1. A tower lift comprising:
a main frame;
a first carriage module and a second carriage module connected with each other inside the main frame at left and right sides of the main frame, respectively, having the same weight as each other, and configured to be moved in a vertical direction;
a driving module installed on the main frame and configured to move the first carriage module and the second carriage module in the vertical direction; and
a fall detection sensor installed on at least one of the first carriage module and the second carriage module and configured to detect fall of at least one of the first carriage module and the second carriage module.

2. The tower lift of claim 1,
wherein the first carriage module and the second carriage module have the same structure as each other.

3. The tower lift of claim 1,
wherein the main frame comprises:
an upper body and a lower body positioned to be spaced apart from each other in the vertical direction; and
a first guide shaft and a second guide shaft positioned to be spaced apart from each other in a horizontal direction and positioned to be parallel to each other in the vertical direction, each of the first and second guide shafts having a first end coupled to the upper body and a second end coupled to the lower body.

4. The tower lift of claim 3, further comprising:
an anti-fall module installed on each of the first carriage module and the second carriage module and configured to prevent the first carriage module and the second carriage module from falling.

5. The tower lift of claim 4,
wherein the anti-fall module is coupled to the first carriage module and is installed adjacent to the first guide shaft.

6. The tower lift of claim 4,
wherein the anti-fall module is coupled to the second carriage module and is installed adjacent to the second guide shaft.

7. The tower lift of claim 1, further comprising:
the fall detection sensor installed on each of the first carriage module and the second carriage module.

8. The tower lift of claim 1,
wherein the driving module comprises:
a timing belt coupled to the first carriage module and the second carriage module; and
a rotary motor installed on the main frame and configured to rotate the timing belt.

9. The tower lift of claim 8, further comprising:
a tension control module disposed at a lower portion of the main frame and configured to control tension of the timing belt.

10. The tower lift of claim 1,
wherein each of the first carriage module and the second carriage module comprises:
a lifting plate installed to be movable along the main frame and configured to be lifted by the driving module;
at least one support plate coupled to the lifting plate; and
a carriage robot installed on the at least one support plate and configured to handle an object.

11. A tower lift comprising:
a main frame comprising a first guide shaft and a second guide shaft spaced apart from each other;
a first carriage module configured to be moved in a vertical direction along the first guide shaft;
a second carriage module configured to be moved in the vertical direction along the second guide shaft, having a weight corresponding to that of the first carriage module, and configured to be moved in a direction opposite to a moving direction of the first carriage module;
a driving module comprising a timing belt having a closed curve shape and coupled to the first carriage module and the second carriage module, and a rotary motor installed on the main frame and configured to rotate the timing belt; and
a fall detection sensor installed on at least one of the first carriage module and the second carriage module and configured to detect fall of at least one of the first carriage module and the second carriage module.

12. The tower lift of claim 11, further comprising:
an anti-fall module installed on each of the first carriage module and the second carriage module and configured to prevent the first carriage module and the second carriage module from falling.

13. The tower lift of claim 12,
wherein the anti-fall module is coupled to the first carriage module and is installed adjacent to the first guide shaft.

14. The tower lift of claim 12,
wherein the anti-fall module is coupled to the second carriage module and is installed adjacent to the second guide shaft.

15. The tower lift of claim 11, further comprising:
the fall detection sensor installed on each of the first carriage module and the second carriage module.

16. The tower lift of claim 11, further comprising:
a tension control module disposed at a lower portion of the main frame and configured to control tension of the timing belt.

17. The tower lift of claim 11,
wherein the first carriage module and the second carriage module have the same structure as each other.

18. The tower lift of claim 11,
wherein the first carriage module comprises:

a lifting plate fixedly coupled to the timing belt and installed to surround the first guide shaft;
at least one support plate coupled to the lifting plate; and
a carriage robot installed on the at least one support plate and configured to handle an object.

19. The tower lift of claim 11,
wherein the second carriage module comprises:
a lifting plate fixedly coupled to the timing belt and installed to surround the second guide shaft;
at least one support plate coupled to the lifting plate; and
a carriage robot installed on the at least one support plate and configured to handle an object.

20. The tower lift of claim 11,
wherein the main frame comprises:
an upper body coupled to an upper end of each of the first guide shaft and the second guide shaft; and
a lower body positioned to be spaced apart downwardly from the upper body and coupled to a lower end of each of the first guide shaft and the second guide shaft.

* * * * *